(12) United States Patent
Hsieh et al.

(10) Patent No.: US 8,765,533 B2
(45) Date of Patent: Jul. 1, 2014

(54) FIN-LIKE FIELD EFFECT TRANSISTOR (FINFET) CHANNEL PROFILE ENGINEERING METHOD AND ASSOCIATED DEVICE

(71) Applicant: Taiwan Semiconductor Manufacturing Company, Ltd, Hsin-Chu (TW)

(72) Inventors: Wen-Hsing Hsieh, Hsinchu (TW); Zhiqiang Wu, Hsinchu (TW); Ching-Fang Huang, Taipei (TW); Jon-Hsu Ho, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/693,685

(22) Filed: Dec. 4, 2012

(65) Prior Publication Data

US 2014/0151761 A1 Jun. 5, 2014

(51) Int. Cl.
*H01L 21/8238* (2006.01)

(52) U.S. Cl.
USPC .......... 438/151; 438/478; 438/197; 257/288; 257/E21.409

(58) Field of Classification Search
USPC .......... 257/288, 347, 401, E21.409, E29.255; 438/151, 478, 197
See application file for complete search history.

(56) References Cited

U.S. PATENT DOCUMENTS

2013/0249003 A1* 9/2013 Oh et al. ................. 257/347

* cited by examiner

*Primary Examiner* — Zandra Smith
*Assistant Examiner* — Paul Patton
(74) *Attorney, Agent, or Firm* — Haynes and Boone, LLP

(57) ABSTRACT

A FinFET device and method for fabricating a FinFET device are disclosed. An exemplary method includes providing a substrate; forming a fin over the substrate; forming an isolation feature over substrate; forming a gate structure including a dummy gate over a portion of the fin, the gate structure traversing the fin, wherein the gate structure separates a source region and a drain region of the fin, a channel being defined in the portion of the fin between the source region and the drain region; and replacing the dummy gate of the gate structure with a metal gate, wherein during the replacing the dummy gate, a profile of the portion of the fin is modified. In an example, modifying the profile of the portion of the fin includes increasing a height of the portion of the fin and/or decreasing a width of the portion of the fin.

20 Claims, 14 Drawing Sheets

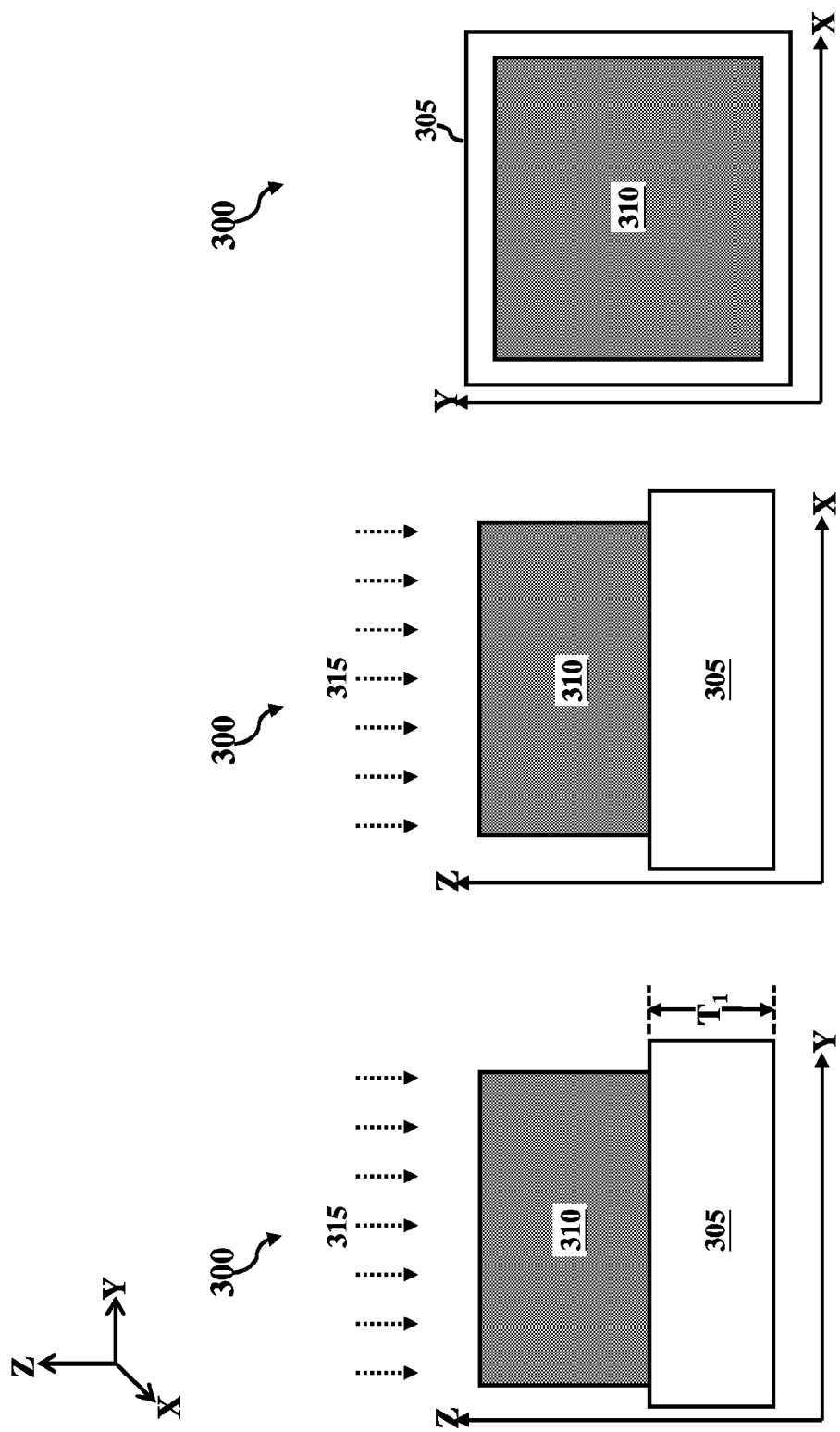

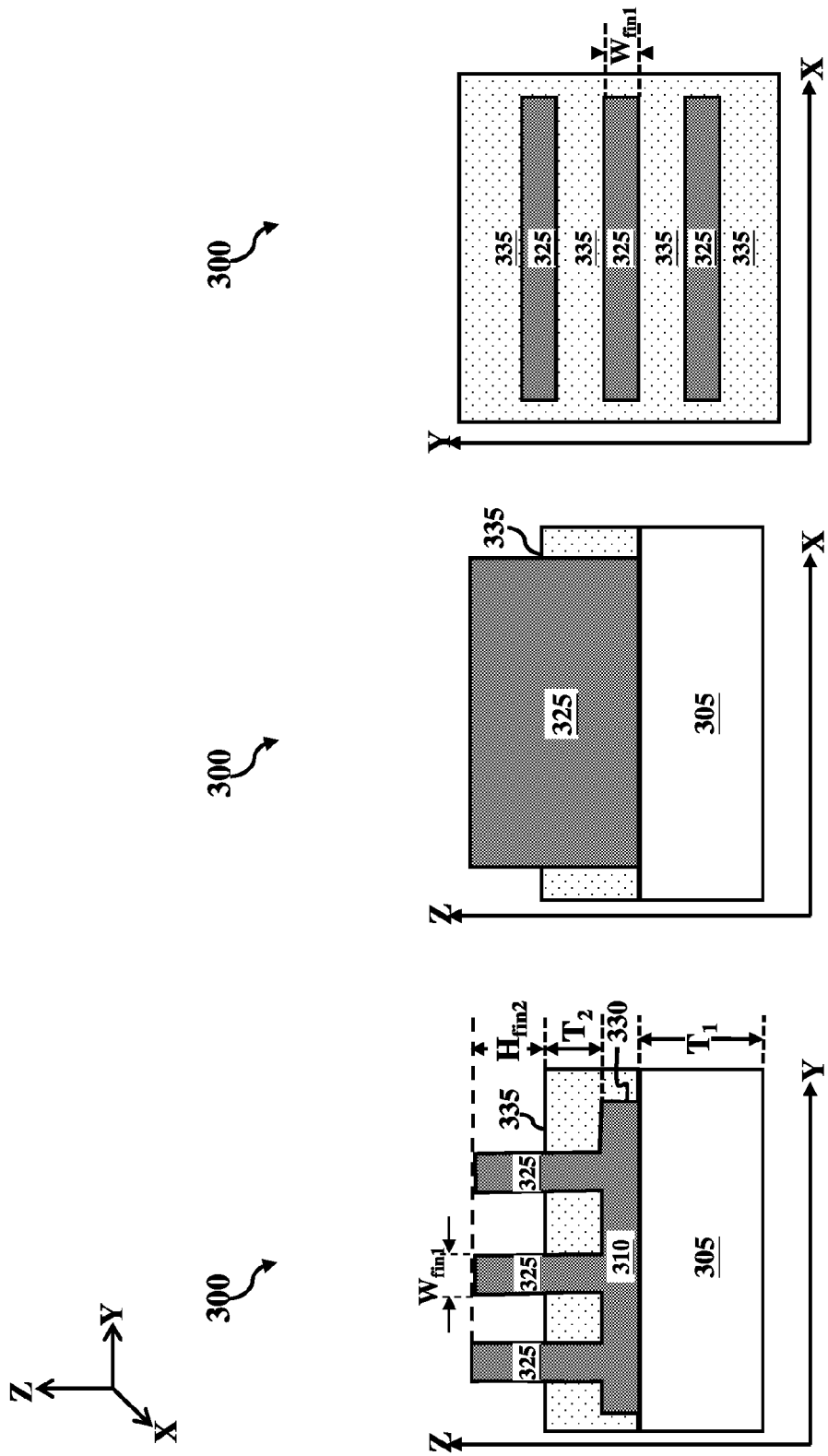

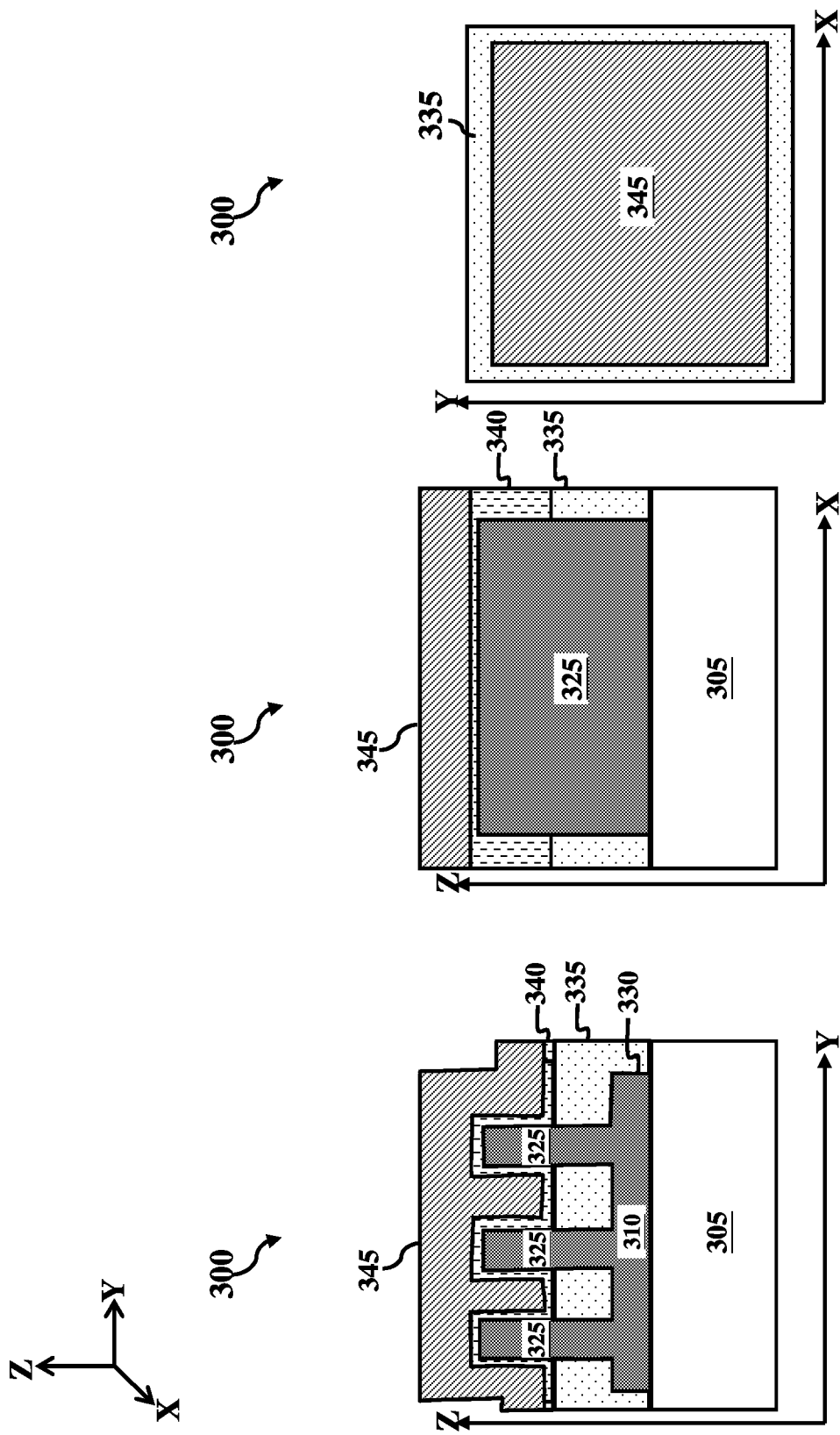

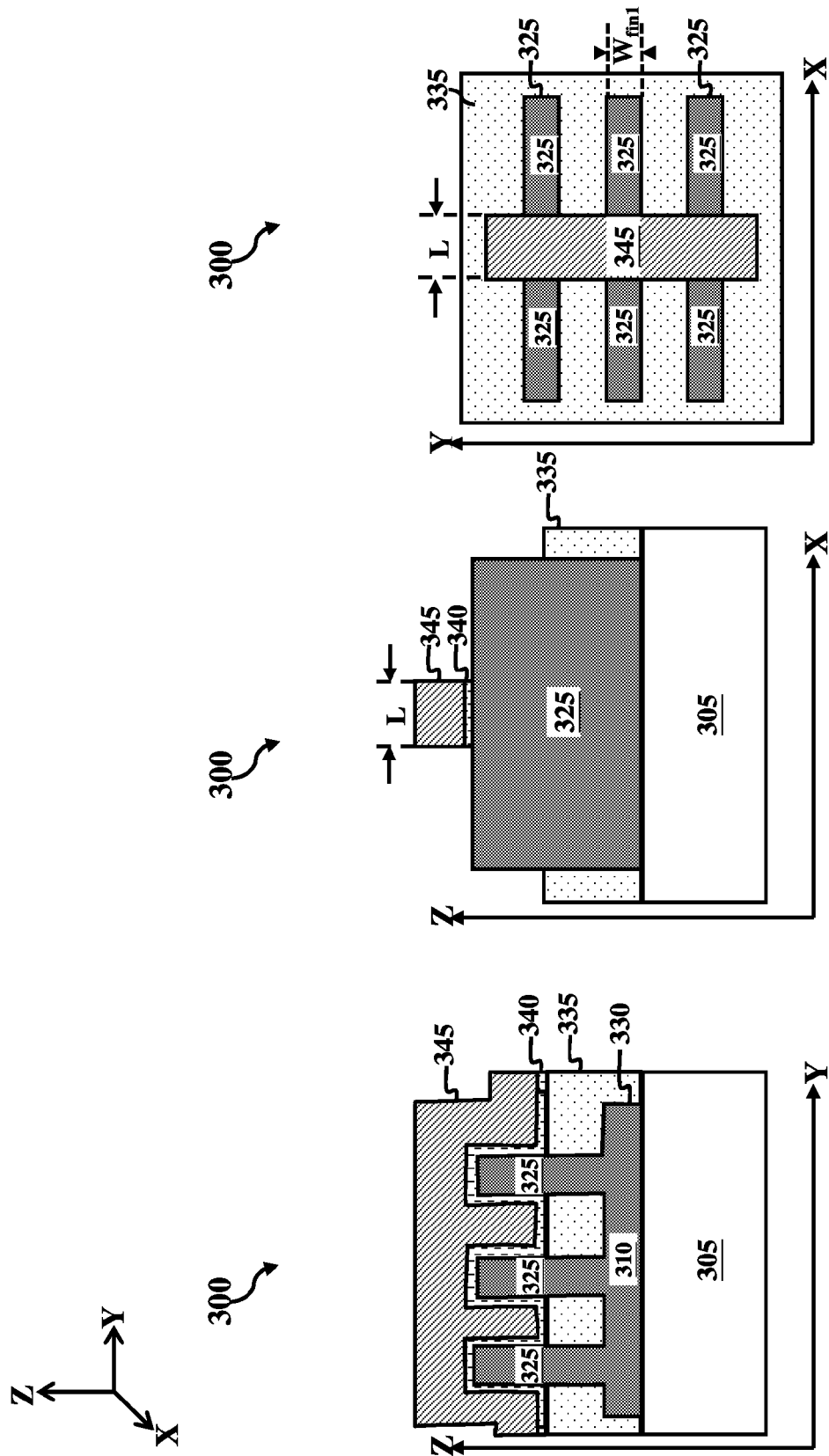

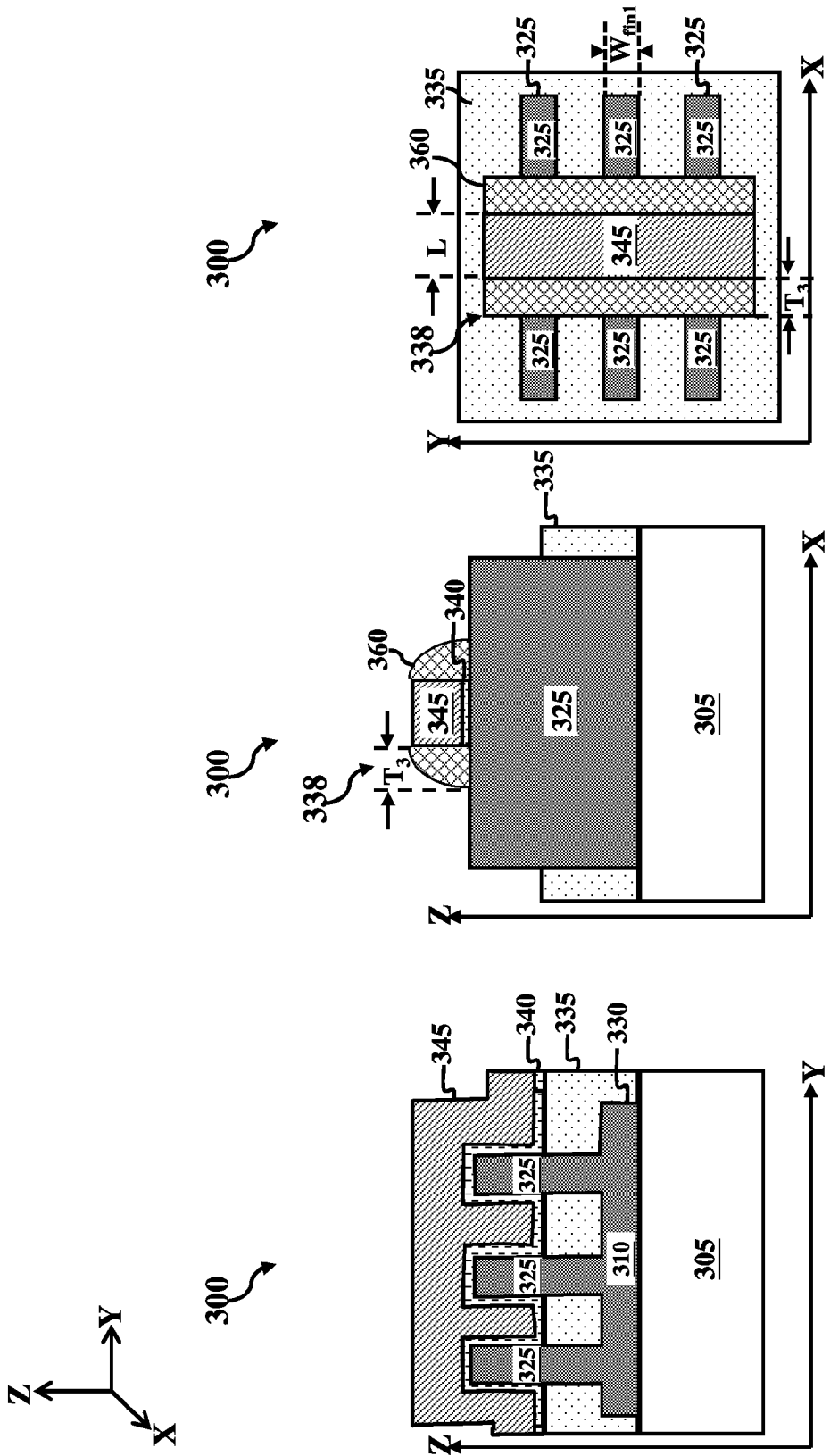

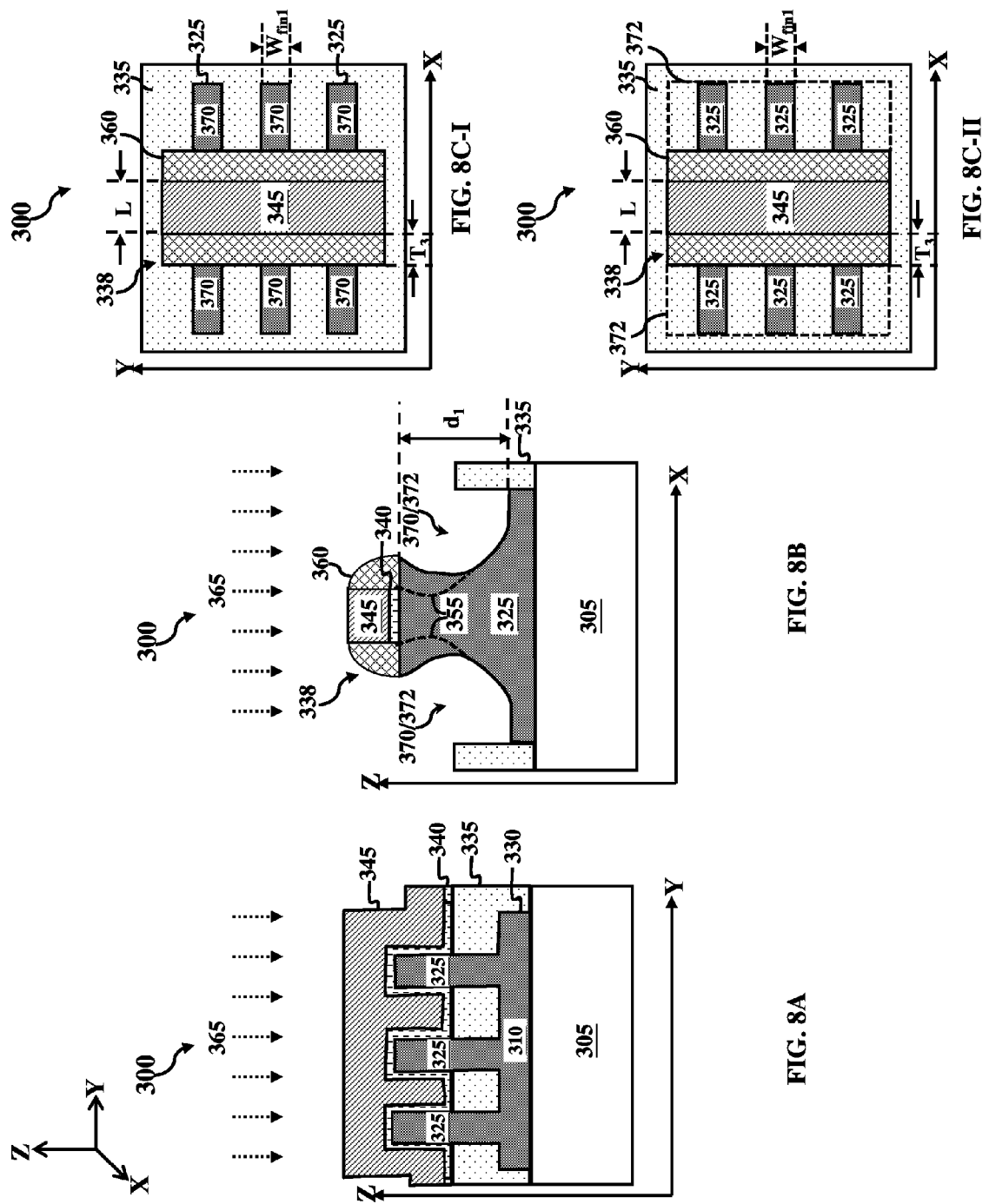

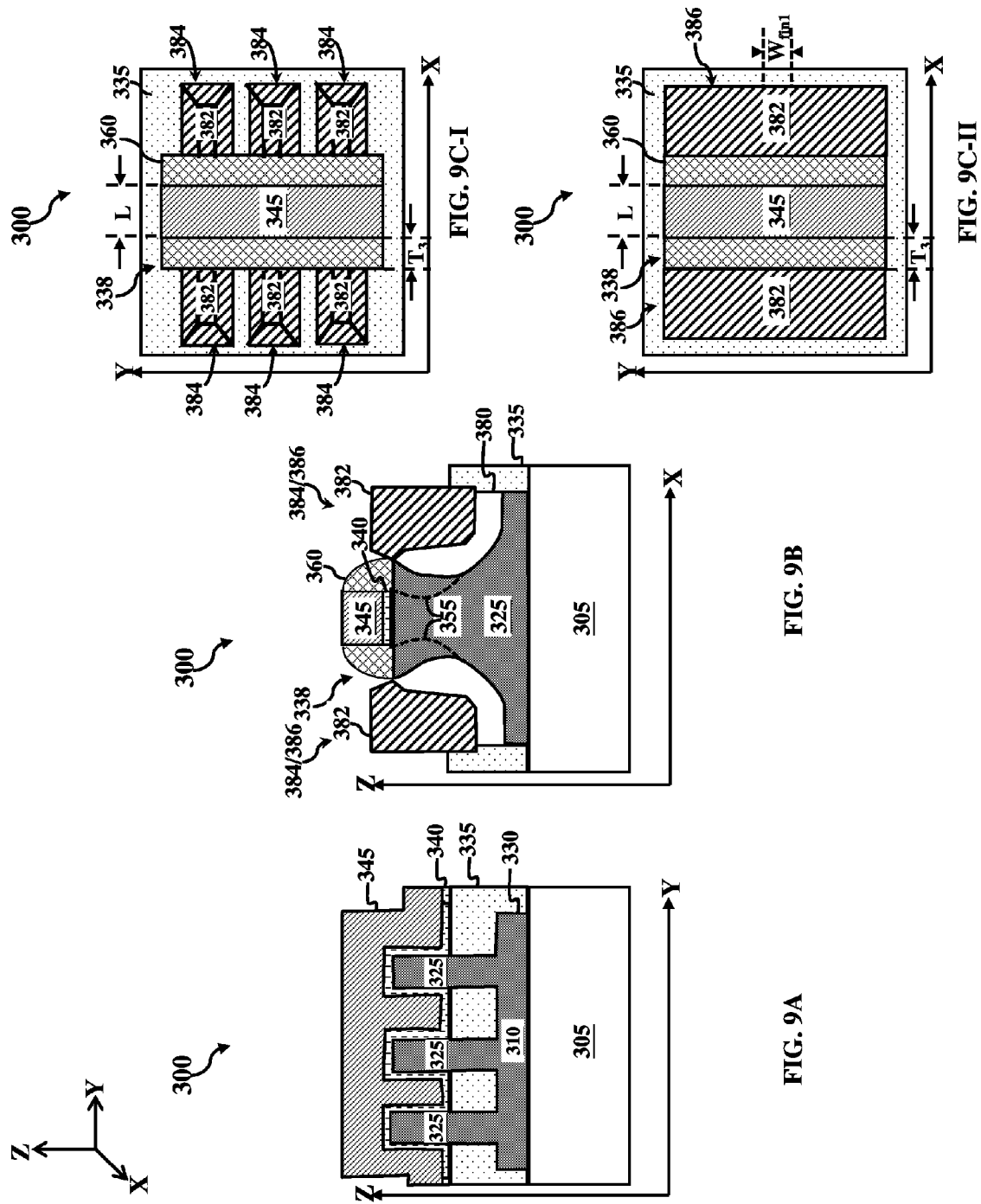

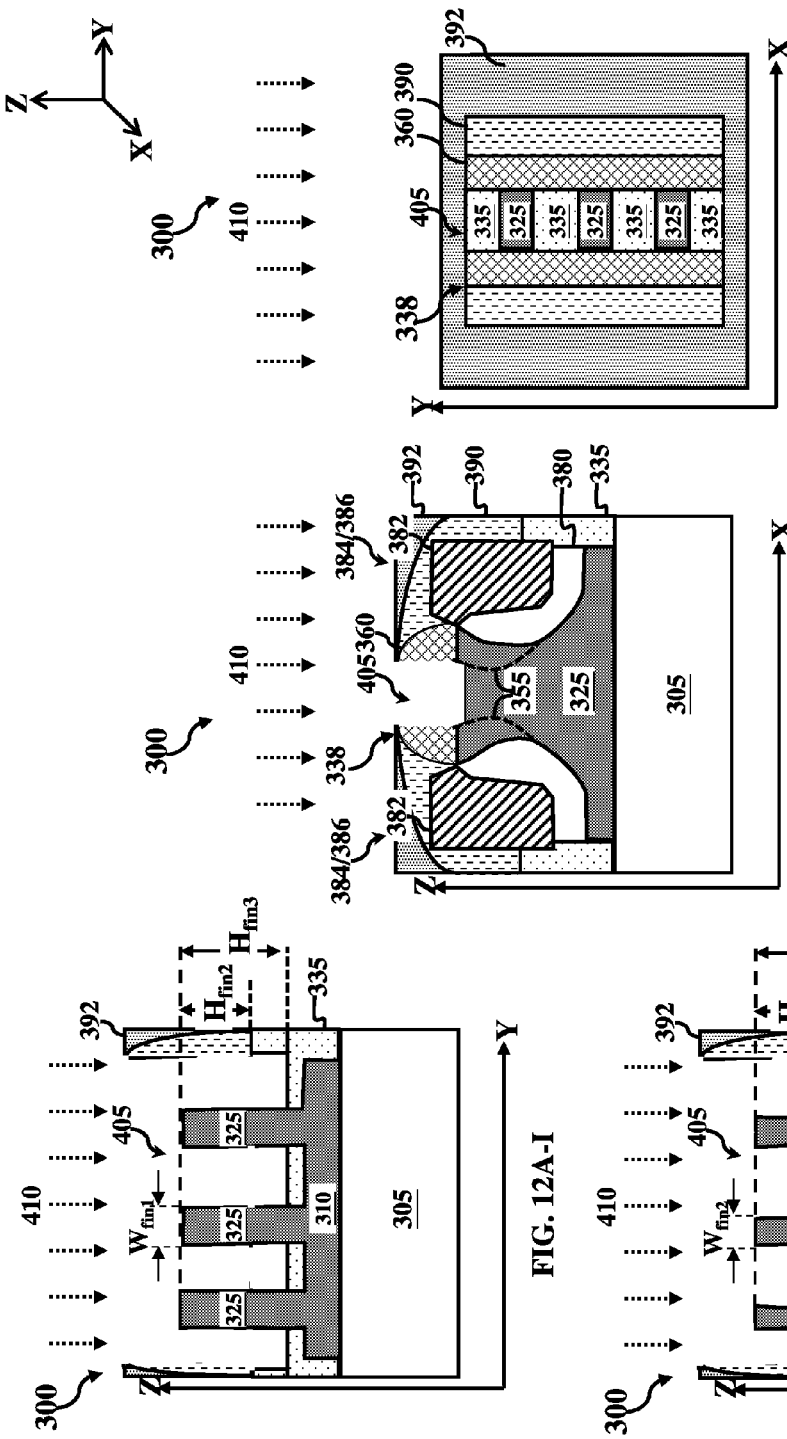

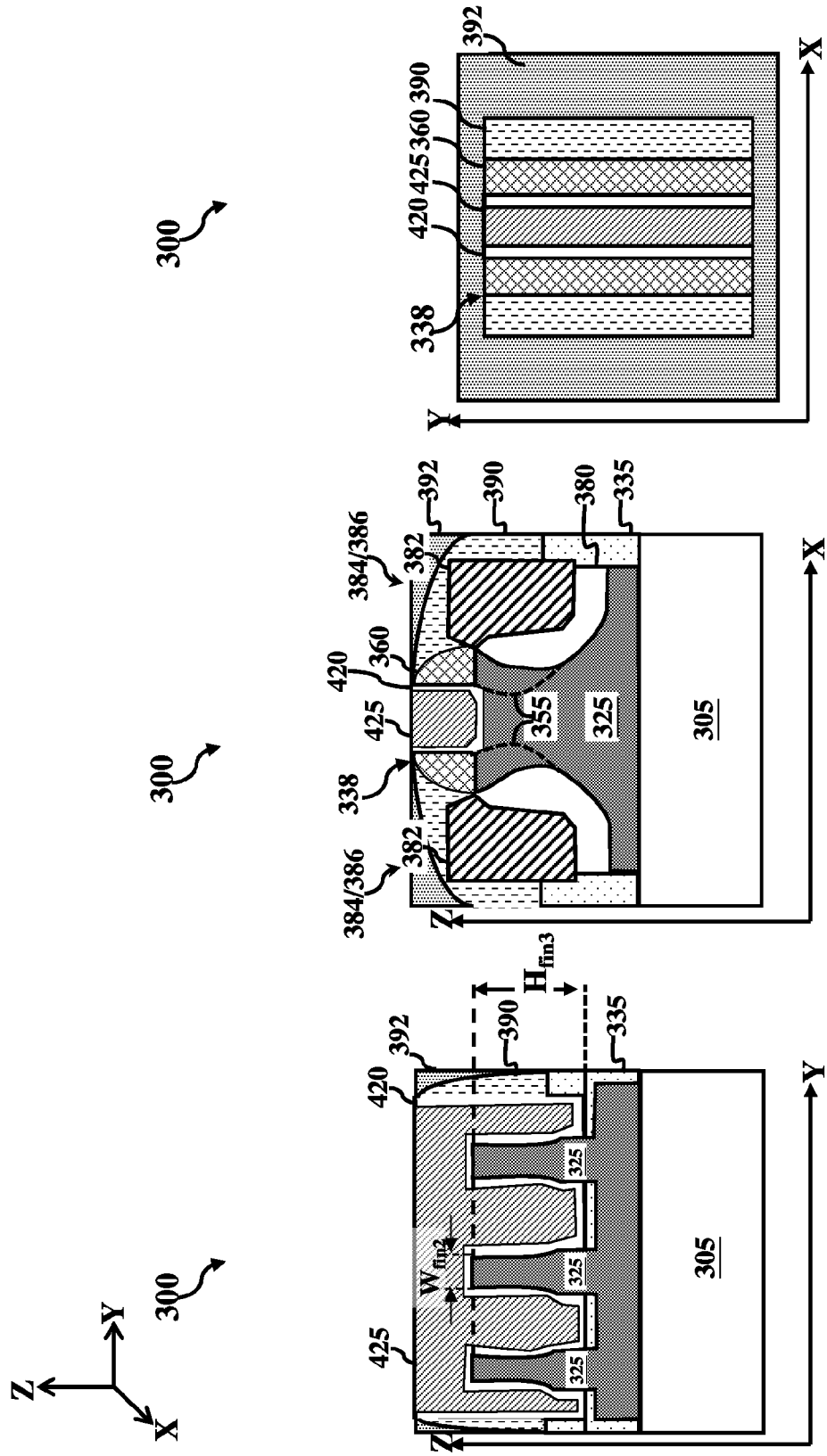

FIN-LIKE FIELD EFFECT TRANSISTOR (FINFET) CHANNEL PROFILE ENGINEERING METHOD AND ASSOCIATED DEVICE

BACKGROUND

As the semiconductor industry has progressed into nanometer technology process nodes in pursuit of higher device density, higher performance, and lower costs, challenges from both fabrication and design have resulted in the development of three dimensional designs, such as fin-like field effect transistors (FinFETs). A typical FinFET is fabricated with a thin "fin" (or fin structure) extending from a substrate, for example, etched into a silicon layer of the substrate. The channel of the FinFET is formed in the vertical fin. A gate is provided over (e.g., wrapping) the fin. Having a gate on both sides of the channel allows gate control of the channel from both sides. FinFET devices also include strained source/drain features to enhance carrier mobility and improve device performance. The strained source/drain features typically use epitaxial (epi) silicon germanium (SiGe) in p-type devices and epi silicon (Si) in n-type devices. FinFET devices provide numerous advantages, including reduced short channel effects and increased current flow. Although existing FinFET devices and methods for fabricating FinFET devices have been generally adequate for their intended purposes, as device scaling down continues, they have not been entirely satisfactory in all respects

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2C, 3A-3C, 4A-4C, 5A-5C, 6A-6C, 7A-7C, 8A-8C, 9A-9C, 10A-10C, 11A-11C, 12A-12C, and 13A-13C provide various views of a FinFET device, in portion or entirety, at various stages of fabrication according to the method of FIG. 1.

DETAILED DESCRIPTION

Figure 1:
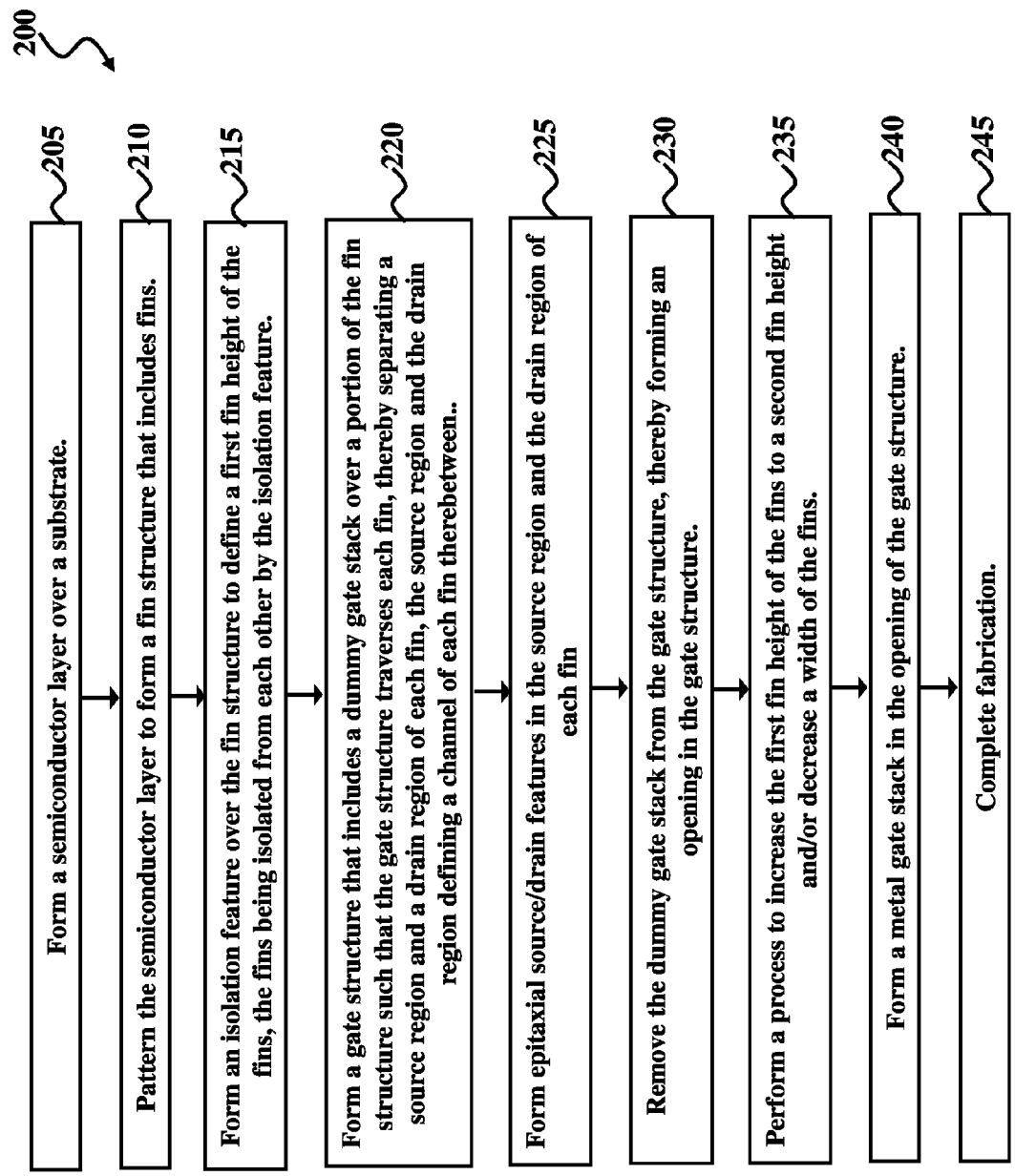
FIG. 1 is a flow chart of a method for fabricating a FinFET device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 200 for fabricating an integrated circuit device according to various aspects of the present disclosure. In the present example, the method 200 fabricates an integrated circuit device that includes a fin-like field effect transistor (FinFET) device. The method 200 begins at block 205 where a semiconductor layer is formed over a substrate. At block 210, the semiconductor layer is patterned to form a fin structure that includes fins. At block 215, an isolation feature is formed over the fin structure to define a first fin height of the fins, the fins being isolated from each other by the isolation feature. At block 220, a gate structure is formed that includes a dummy gate stack over a portion of the fin structure, such that the gate structure traverses each fin, thereby separating a source region and a drain region of each fin. A channel of each fin is defined between the source region and the drain region. At block 225, epitaxial source/drain features are formed in the source region and the drain region of each fin. At block 230, the dummy gate stack is removed from the gate structure, thereby forming an opening in the gate structure. At block 235, a process is performed to increase the first fin height of the fins to a second fin height and/or decrease a width of the fins. At block 240, a metal gate is formed in the opening of the gate structure. At block 245, the method 200 may continue to complete fabrication of the FinFET device. Additional steps can be provided before, during, and after the method 200, and some of the steps described can be replaced or eliminated for additional embodiments of the method 200. The discussion that follows illustrates various embodiments of an integrated circuit device that can be fabricated according to the method 200.

FIGS. 2A-2C, 3A-3C, 4A-4C, 5A-5C, 6A-6C, 7A-7C, 8A-8C, 9A-9C, 10A-10C, 11A-11C, 12A-12C, and 13A-13C provide various views of a FinFET device 300, in portion or entirety, at various stages of fabrication according to the method 200 of FIG. 1. The term FinFET device refers to any fin-based transistor, such as a fin-based, multi-gate transistor. In various embodiments, the FinFET device 300 is included in a microprocessor, memory cell, and/or other integrated circuit device. FIGS. 2A-2C, 3A-3C, 4A-4C, 5A-5C, 6A-6C, 7A-7C, 8A-8C, 9A-9C, 10A-10C, 11A-11C, 12A-12C, and 13A-13C have been simplified for the sake of clarity to better understand the inventive concepts of the present disclosure. Additional features can be added in the FinFET device 300, and some of the features described below can be replaced or eliminated in other embodiments of the FinFET device 300.

In FIGS. 2A-2C, the FinFET device 300 includes a substrate (wafer) 305 having a thickness ($T_1$). In the depicted embodiment, the substrate 305 is a silicon substrate. Alternatively or additionally, the substrate 305 includes an elementary semiconductor, such as germanium; a compound semiconductor, such as silicon carbide, gallium arsenic, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. Alternatively, the substrate 305 is a silicon-on-insulator (SOI) substrate. The SOI substrate can be fabricated using separation by implantation of oxygen (SIMOX), wafer bonding, and/or other suitable methods. The substrate 305 may include various doped regions and other features depending on design requirements of the FinFET device 300.

A semiconductor layer 310 is formed over the substrate 305. In the depicted embodiment, the semiconductor layer 310 is a silicon layer. Alternatively or additionally, the semiconductor layer 310 includes an elementary semiconductor, such as germanium; a compound semiconductor, such as silicon carbide, gallium arsenic, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. An ion implantation process 315 is performed to dope the semiconductor layer 310. In the depicted embodiment, the semiconductor layer 310 is doped with p-type dopants, such as boron, $BF_2$, indium, other p-type dopant, or combination thereof. Alternatively, the semiconductor layer 310 is doped with n-type dopants (such as phosphorus, arsenic, other n-type dopant, or combination thereof), or a combination of p-type and n-type dopants. In an example, a doping concentration of the implanted dopants is about $1\times10^{17}$ ions/cm$^3$ to about $5\times10^{19}$ ions/cm$^3$.

Figures 3A, 3B, 3C:
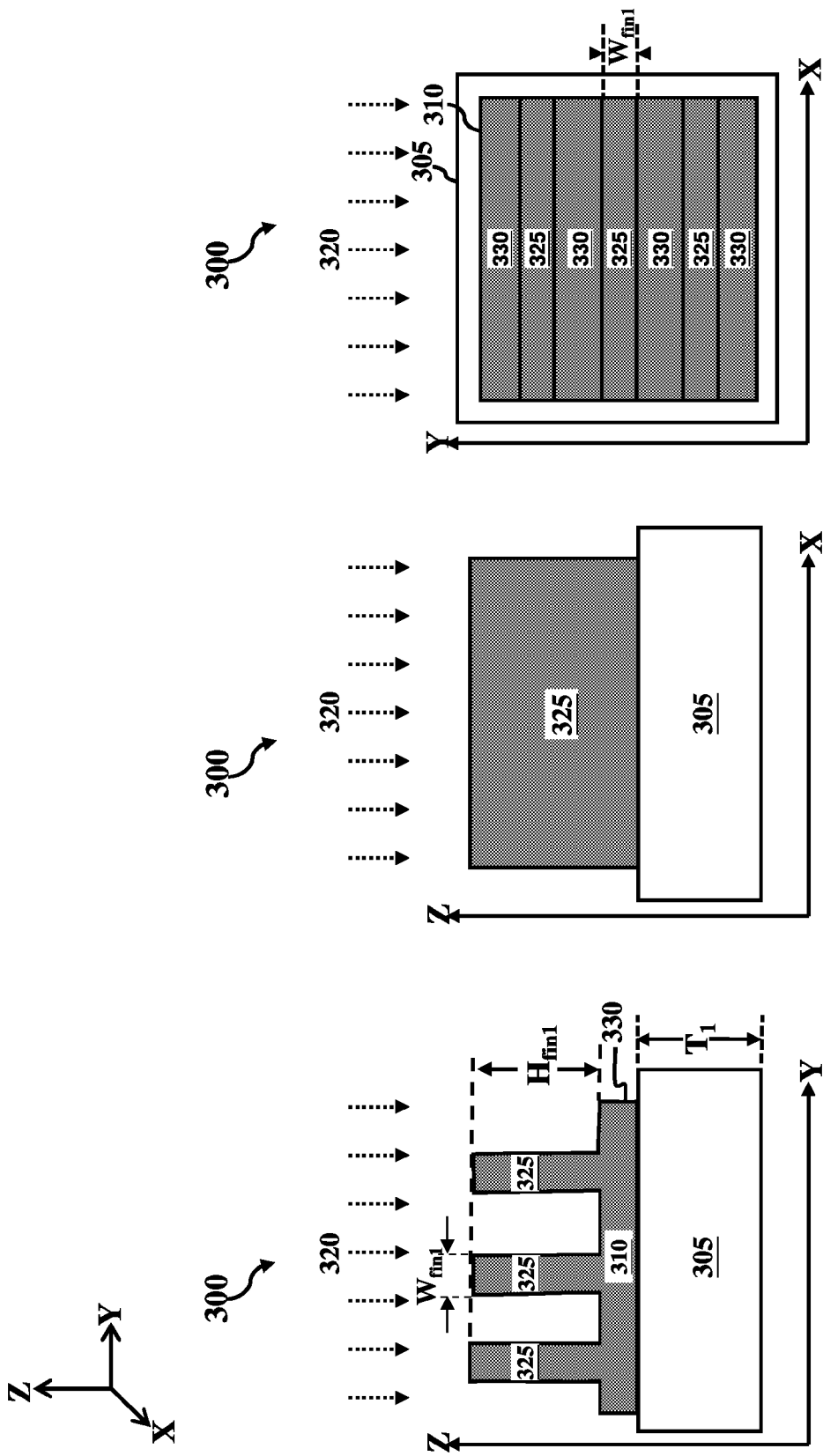

In FIGS. 3A-3C, the semiconductor layer 310 undergoes a process 320 to form a fin structure that includes fins 325 that extend from a fin platform 330 (also referred to as a fin bottom), particularly, a portion of the semiconductor layer 310. Alternatively, the fins 325 extend from the substrate 305, such that the fins 325 are extensions of the substrate 305. The fin structure may include more or less fins 325 depending on design requirements of the FinFET device 300. The fins 325 extend along the x-direction, and each fin has a width ($W_{fin1}$) defined in the y-direction and a height ($H_{fin1}$) defined in the z-direction. In an example, the width ($W_{fin1}$) is about 2 nm to about 15 nm. In the present example, the process 320 is a lithography and etching process that forms trenches in the semiconductor layer 310, thereby forming the fins 325 that extend from the semiconductor layer 310 (in the present example, from the fin platform 330). In an example, the lithography process includes resist coating (for example, spin-on coating), soft baking, mask aligning, exposure, post-exposure baking, developing the resist, rinsing, drying (for example, hard baking), other suitable processes, or combinations thereof. Alternatively, the lithography process can be implemented or replaced by other methods, such as maskless lithography, electron-beam writing, ion-beam writing, and/or nanoimprint technology. The etching process includes a dry etching process, wet etching process, other suitable etching process, or combinations thereof. In an example, the fins 325 are formed by forming a resist layer over the semiconductor layer 310, exposing the resist to a pattern, and developing the resist to form a masking element including the resist. The masking element is then used to etch the fins 325 into the semiconductor layer 310, for example, by a reactive ion etch (RIE). In another example, the fins 325 are formed by a double-patterning lithography (DPL) process. DPL is a method of constructing a pattern on a substrate by dividing the pattern into two interleaved patterns. DPL allows enhanced feature (for example, fin) density. Various DPL methodologies may be used including double exposure (such as using two mask sets), resist freezing, other suitable processes, or combinations thereof.

In FIGS. 4A-4C, an isolation feature 335, such as a shallow trench isolation (STI) structure and/or a local oxidation of silicon (LOCOS) structure, is formed to surround the fin structure and isolate the fins 325 from each other. The isolation feature 335 includes silicon oxide, silicon nitride, silicon oxynitride, other isolation material, or combinations thereof. In the depicted embodiment, the isolation feature 335 includes an oxide material, such as silicon oxide. The isolation feature 335 is formed by any suitable process, such as a chemical vapor deposition (CVD) process, a physical vapor deposition (PVD) process, an atomic layer deposition (ALD) process, or a combination thereof. In the depicted embodiment, the isolation feature 335 is formed by partially filling the trenches etched in the semiconductor layer 310 with an insulating material, such that the isolation feature 335 has a thickness ($T_2$) and the isolation feature 335 defines a height ($H_{fin2}$) of the fins 325. In the present example, forming the isolation feature 335 reduces a height of the fins from the height ($H_{fin1}$) to the height ($H_{fin2}$). In an example, the height ($H_{fin2}$) is about 10 nm to about 25 nm. In an example, the thickness ($T_2$) of the isolation feature 335 is greater than or equal to about 3 nm. As discussed further below, the thickness of the isolation feature 335 is adjusted depending on design requirements of the source and drain features of the integrated circuit device 300. For example, in some instances, the thickness of the isolation feature 335 is greater than a depth of source and drain recesses formed for epitaxial source and drain features of the FinFET device 300. In other instances, the thickness of the isolation feature 335 is less than or equal to the depth of the source and drain recesses formed for the source and drain features of the FinFET device 300.

In FIGS. 5A-5C, FIGS. 6A-6C, and FIGS. 7A-7C, a gate structure 338 is formed over the fin structure. The gate structure 338 includes a dummy gate stack that includes a dummy gate dielectric 340 and a dummy gate electrode 345. The dummy gate dielectric 340 includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In the depicted embodiment, the dummy gate electrode 345 includes polysilicon. Alternatively, the dummy gate electrode includes a metal including Al, Cu, Ti, Ta, W, Mo, TaN, NiSi, CoSi, TiN, WN, TiAl, TiAlN, TaCN, TaC, TaSiN, other conductive materials, or combinations thereof. The dummy gate stack of the gate structure 338 may include numerous other layers, for example, capping layers, interface layers, diffusion layers, barrier layers, hard mask layers, or combinations thereof. In an example, a capping layer, such as a TiN capping layer, is disposed between the dummy gate dielectric 340 and the dummy gate electrode 345. In an example, such capping layer is disposed between the dummy gate dielectric 340 and the dummy gate electrode 345 in the z-direction. In an example, such capping layer has a thickness of about 1 nm to about 20 nm.

The gate structure 338 is formed by deposition processes, lithography patterning processes, etching processes, other suitable processes, or combinations thereof. For example, in FIGS. 5A-5C, a deposition process is performed to form a gate dielectric layer (dummy gate dielectric 340) over the fin structure, particularly the fins 325 and the isolation feature 335, and a gate electrode layer (dummy gate electrode 345) over the gate dielectric layer. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. In FIGS. 6A-6C, a lithography patterning and etching process is performed to pattern the gate dielectric layer and the gate electrode layer to form the dummy gate stack including the dummy gate dielectric 340 and the dummy gate electrode 345. The lithography patterning processes include resist coating (for example, spin-on coating), soft baking, mask aligning, exposure, post-exposure baking, developing the photoresist, rinsing, drying (for example, hard baking), other suitable processes, or combinations thereof. Alternatively, the lithography exposing process is implemented or replaced by other methods, such as maskless lithography, electron-beam writing, or ion-beam writing. In yet another alternative, the lithography patterning process implements nanoimprint technology. The etching processes include dry etching, wet etching, other etching methods, or combinations thereof. In the present example, the lithography patterning and etching process defines a length (L) of the gate structure 338 (in other words, a length of the dummy gate stack) along the x-direction. In an example, the length (L) of the gate structure 338 is about 5 nm to about 30 nm.

The gate structure 338 wraps the fins 325 in the y-z plane. In the present example, the gate structure 338 wraps a portion of each fin 325, particularly wrapping a channel region of each fin 325. In the x-z plane and the x-y plane, the gate structure 338 interposes a source region and a drain region of the FinFET device 300.

In FIGS. 7A-7C, the gate structure 338 further includes spacers 360. The spacers 360 are disposed on sidewalls of the dummy gate stack of the gate structure 338, such as along sidewalls of the dummy gate dielectric 340 and the dummy gate electrode 345. The spacers 360 include a dielectric material, such as silicon oxide, silicon nitride, silicon oxynitride, other suitable material, or combinations thereof. In an example, the spacers 360 include a multi-layer structure, such as a multi-layer structure including a silicon nitride layer and a silicon oxide layer. The spacers are formed by a suitable process to a thickness ($T_3$). For example, in the depicted embodiment, spacers 360 are formed by depositing a silicon nitride layer and then dry etching the silicon nitride layer to form the spacers 360 as illustrated in FIGS. 7B and 7C.

In FIGS. 8A-8C, a process 365 removes portions of each fin 325 from the source and drain regions of the fin structure to form source and drain recesses. In the depicted embodiment, an etching process removes portions of each fin 325 from the source and drain regions of the fin structure to form source and drain recesses 370 (FIG. 8C-I), or an etching process removes portions of each fin 325 from the source and drain regions of the fin structure and adjacent portions of the isolation feature 335 to form source and drain recesses 372 (FIG. 8C-II). More specifically, in FIG. 8C-I, the fins 325 are etched in the source and drain regions, such that each fin 325 has an associated source and drain recess 370. In contrast, in FIG. 8C-II, the fins 325 in the source and drain regions and adjacent isolation feature 335 are etched, such that the etched portions of the fins 325 and isolation feature 335 combine to form source and drain recess 372. The etching process is a dry etching process, wet etching process, other etching process, or combinations thereof. In the depicted embodiment, the recesses 370/372 have a depth ($d_1$).

In FIGS. 9A-9C, epitaxial source/drain features are formed in the source and drain regions of the fin structure. For example, a semiconductor material is epitaxially (epi) grown on the exposed fins 325, forming epitaxial layer 380 and epitaxial layer 382, thereby forming raised source/drain features 384 (FIG. 9C-I) and raised source/drain features 386 (FIG. 9C-II). More specifically, in FIG. 9C-I, the semiconductor material is epitaxially grown by an epi process to form the epitaxial source/drain features 384 for each fin 325. In contrast, in FIG. 9C-II, the semiconductor material is epitaxially grown by an epi process until the epitaxial features of each fin 325 merges together to form the continuous epitaxial source/drain feature 386. The semiconductor material fills the recesses 370/372. The epitaxy process uses CVD deposition techniques (e.g., vapor-phase epitaxy (VPE) and/or ultra-high vacuum CVD (UHV-CVD)), molecular beam epitaxy, and/or other suitable processes. The epitaxy process uses gaseous and/or liquid precursors, which interact with the composition of the fins 325 (in other words, interact with the Si fins 325). In the depicted embodiment, the epitaxial layer 380 is an undoped epitaxial layer, and the epitaxial layer 382 is a heavily doped epitaxial layer. In an example, a doping concentration of the heavily doped epitaxial layer 382 is about $5 \times 10^{19}$ ions/cm$^3$ to about $8 \times 10^{20}$ ions/cm$^3$. The undoped epitaxial layer is configured to minimize leakage current between the source and drain regions. Where the FinFET device 300 is configured as an n-type device, the epitaxial layer 380 and the epitaxial layer 382 are silicon epitaxial layers, where the silicon epitaxial layer 382 is doped with carbon, phosphorous, other n-type dopant, or a combination thereof (for example to form a Si:C epitaxial layer or a Si:C:P epitaxial layer), such that the epitaxial source/drain features 384/386 induce tensile stress in the channel of the fins 325. Where the FinFET device 300 is configured as a p-type device, the epitaxial layer 380 and epitaxial layer 382 are silicon germanium (SiGe) layers, such that the epitaxial source/drain features 384/386 induce compressive stress in the channel of the fins 325. In other examples, the epitaxial layers 380 and 382 include materials that achieve desired tensile and compressive stress in the channel of the fins 325. The epitaxial layer 382 is doped during deposition (growth) by adding impurities to the source material of the epitaxy process or subsequent to its deposition growth process by an ion implantation process.

Figures 10A, 10B, 10C:
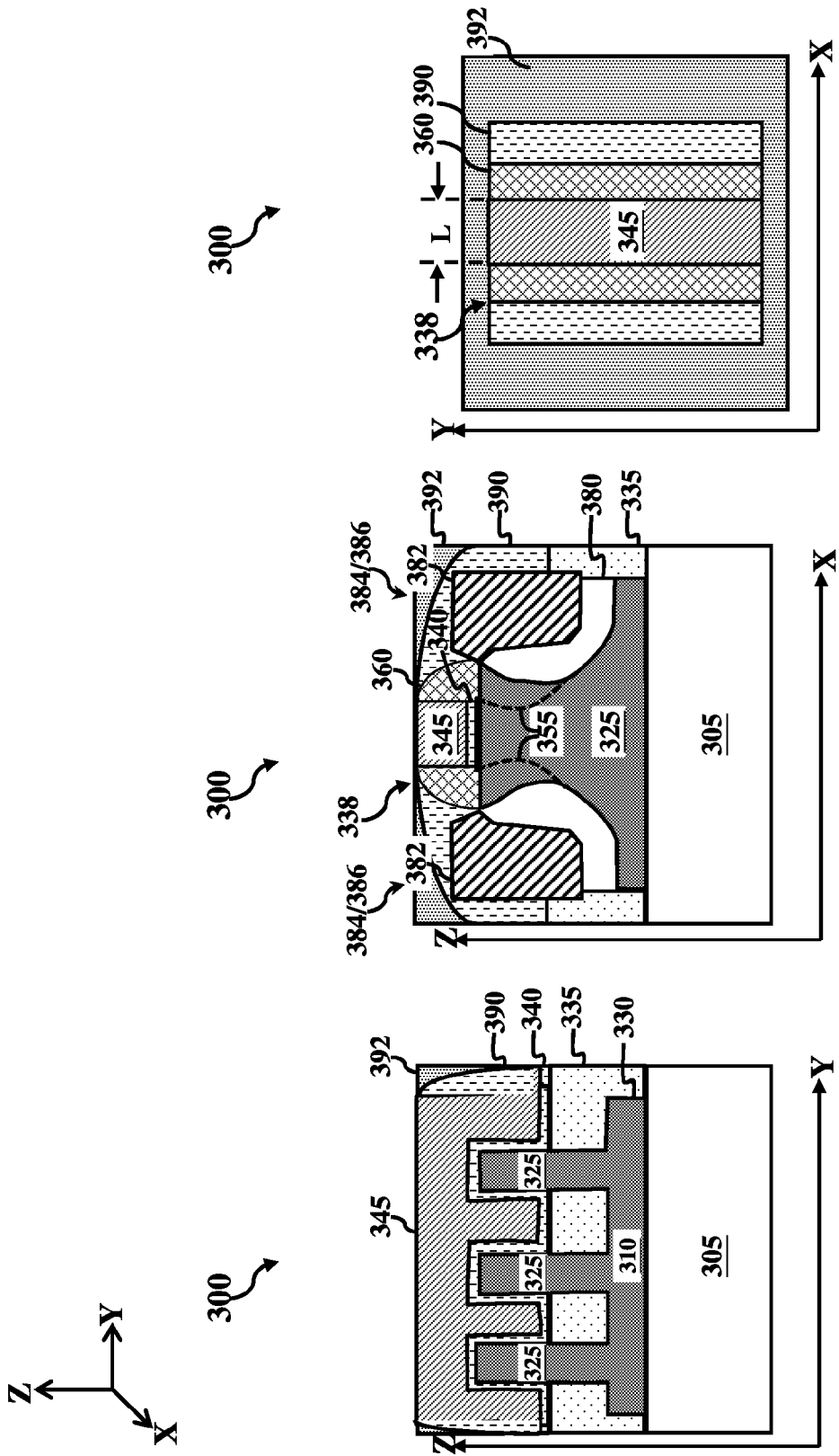

In FIGS. 10A-10C, a contact etch stop layer (CESL) 390 and an inter-level dielectric (ILD) layer 392 are formed over the substrate 310, for example, by a deposition process (such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof). In the present example, the CESL 390 is formed over the substrate 310, and the ILD layer 392 is formed over the CESL 390. The CESL 390 and the ILD layer 392 include a dielectric material, such as silicon oxide, silicon nitride, silicon oxynitride, TEOS formed oxide, phosphosilicate glass (PSG), borophosphosilicate glass (BPSG), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. In the depicted embodiment, the ILD layer 392 is a low-k dielectric layer. The ILD layer 392 can include a multilayer structure having multiple dielectric materials. Subsequent to the deposition of the CESL 390 and the ILD layer 392, a chemical mechanical polishing (CMP) process is performed, such that a top portion of the gate structure 338 is reached (exposed), particularly, a top portion of the dummy gate stack (dummy gate electrode 345) as illustrated in FIG. 10B.

Figures 11A, 11B, 11C:
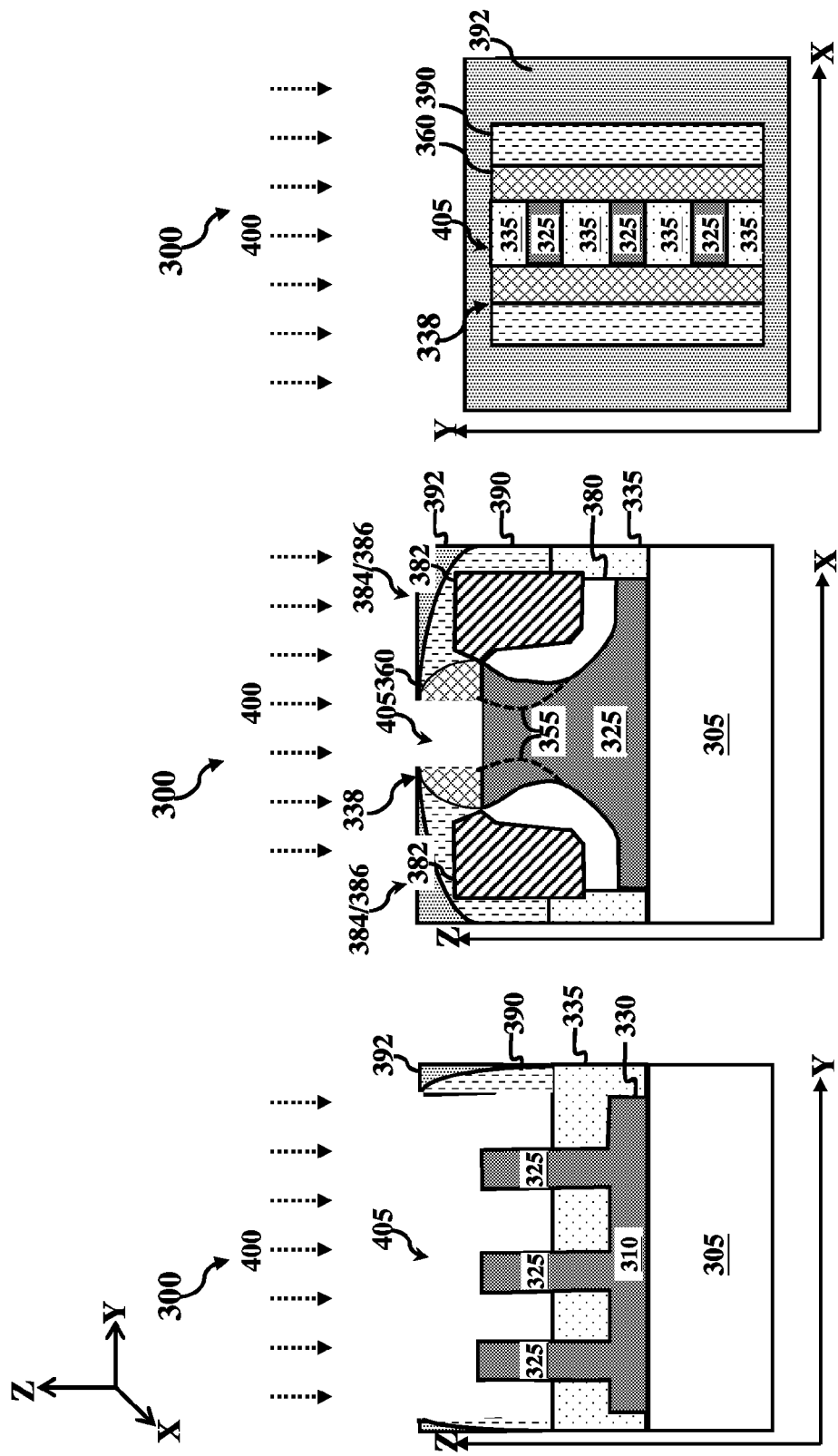

In FIGS. 11A-11C, FIGS. 12A-12C, and FIGS. 13A-13C, a gate replacement process is performed, where the dummy gate electrode 345 is replaced with a gate, such as a metal gate, as further described below. Referring to FIGS. 11A-11C, a process 400 is performed to remove the dummy gate dielectric 340 and the dummy gate electrode 345, thereby forming a trench (opening) 405. The opening 405 exposes the fins 325, and in particular, exposes the channel region of each fin 325 (in the x-z plane and x-y plane). In the depicted embodiment, the process 400 is an etching process that selectively removes the dummy gate electrode 345 and the dummy gate dielectric 340. The etching process is a dry etching process, a wet etching process, or combinations thereof.

In FIGS. 12A-12C, a process 410 is performed to modify a profile of the portion of the fins 325 exposed by the opening 405. In the depicted embodiment, the portion of the fins 325 modified is associated with the channel of the FinFET device 300. In the present example, an etching process is performed to modify the profile of the portion of the fins 325 exposed by the opening, particularly to increase a height of the fins 325 and/or decrease a width of the fins 325. For example, in FIG. 12A-I, the etching process etches back the isolation feature 335 to increase the fin height ($H_{fin2}$) to fin height ($H_{fin3}$). In an example, the fin height ($H_{fin3}$) is greater than about 35 nm. In furtherance of the present example, in FIG. 12A-II, the etching process is continued to decrease the width ($W_{fin1}$) to fin width ($W_{fin2}$). In an example, the fin width ($W_{fin2}$) is less than about 8 nm. The etching process includes a dry etching process, a wet etching process, other etching process, or combination thereof. The etching process is tuned to modify the profile of the portion of the fin 325 associated with the channel of the FinFET device 300, such that improvement in device performance is realized. In an example, the etching process is tuned to achieve a high aspect ratio of the portions of the fins 325 associated with the channel. For example, the etching process is tuned to achieve a fin height ($H_{fin3}$) to fin width ($W_{fin2}$) of about 1:4 to about 1:7 (in other words, $H_{fin3}:W_{fin2}$=about 1:4 to about 1:7). In an example, the etching process is an oxide etching process. In an example, separate etching processes are performed to increase the height of the fins 325 (FIG. 12A-I) and decrease the width of the fins 325 (FIG. 12A-II). In another example, a single etching process is performed to increase the height of the fins 325 (FIG. 12A-I) and decrease the width of the fins 325 (FIG. 12A-II). In an example, the etching process is also used to increase a length of the channel in the x-direction (FIG. 12B). For example, an isotropic etching process is used to enlarge the length of the channel of the fins 325 in the x-direction.

Modifying the profile of the portion of the fins 325 associated with the channel during the gate replacement process minimizes (or eliminates) several difficulties faced by conventional fabrication processes. For example, conventional fabrication processes typically maximize the height of the fins 325 before the gate replacement process. This leads to an increase in volume of the epitaxial source/drain features (such as epitaxial source/drain features 384/386), which leads to capacitance degradation (in other words, an increase in total capacitance) and consequently decreased device performance. By maximizing the height of the portions of the fins 325 associated with the channel during the gate replacement process, instead of the fins 325 before the gate replacement process, the volume of the epitaxial source/drain features 384/386 is maintained at a level that minimizes capacitance degradation. In another example, conventional fabrication processes typically minimize the width of the fins 325 before the gate replacement process. This leads to insufficient area for forming the epitaxial source/drain features, increasing processing complexity in forming the epitaxial source/drain features as technology nodes continually scaled down. In addition, the fins having the minimized width cannot withstand subsequent processing temperature, resulting in thermal deformation of the fins. By minimizing the width of the portions of the fins 325 associated with the channel during the gate replacement process, instead of the fins 325 before the gate replacement process, thermal deformation of the fins 325 is avoided since processing after gate replacement typically implements low temperature processes, and the initial, larger fin width ($W_{fin1}$) provides an adequate template for forming the epitaxial source/drain features 384/386. Further, the minimized fin width ($W_{fin2}$) reduces short channel effects arising in the FinFET device 300, further improving device performance. It is further noted that modifying the profile of the portions of the fins 325 during the gate replacement process is easily and cost-effectively integrated into existing fabrication processes. Different embodiments may have different advantages, and no particularly advantage is necessarily required of any embodiment.

In FIGS. 13A-13C, a metal gate stack is formed in the trench (opening) 415. The metal gate stack includes a gate dielectric 420 and a gate electrode 425. The metal gate stack of the gate structure 338 may include numerous other layers, for example, capping layers, interface layers, diffusion layers, barrier layers, hard mask layers, or combinations thereof. In the depicted embodiment, the gate dielectric 420 includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In an example, the gate dielectric 420 includes an interfacial layer (such as a silicon oxide layer) disposed over the fins 325, and a high-k dielectric layer disposed over the interfacial layer. The gate electrode 425 includes a work function layer, which is a conductive layer tuned to have a desired work function (such as an n-type work function or a p-type work function), and a conductive layer formed over the work function layer. In various examples, the work function layer includes tantalum, tantalum nitride, nickel silicide, cobalt silicide, TiN, WN, TiAl, TiAlN, TaCN, TaC, TaSiN, other suitable material, or combination thereof. The conductive material layer formed over the work function layer includes a suitable conductive material, such as aluminum, tungsten, or copper. The conductive material layer may additionally or collectively include polysilicon, titanium, tantalum, metal alloys, other suitable materials, and/or combinations thereof. The gate dielectric 420 and the gate electrode 425 are formed similar to the dummy gate dielectric 340 and the dummy gate electrode 345. In the present example, a chemical mechanical polishing (CMP) process is performed to planarize FinFET device 300.

The FinFET device 300 can undergo subsequent processing to complete fabrication of the FinFET device 300. For example, silicide features are formed in the source and drain regions of the fins 325. In an example, the silicide features are formed by a silicidation process, such as a self-aligned silicide (salicide) process. Various contacts/vias/lines and multilayer interconnect features (for example, a combination of conductive layer and insulating layers) are formed over the substrate 310, configured to connect the various features or structures of the FinFET device 300. The additional features can provide electrical interconnection to the FinFET device 300, such as to the gate structure 338 and/or the source/drain features of the fins 325. For example, a multilayer interconnection includes vertical interconnects, such as conventional vias or contacts, and horizontal interconnects, such as metal lines. The various interconnection features may implement various conductive materials including copper, tungsten, and/ or silicide. In one example, a damascene and/or damascene process is used to form a copper related multilayer interconnection structure.

Figure 14:
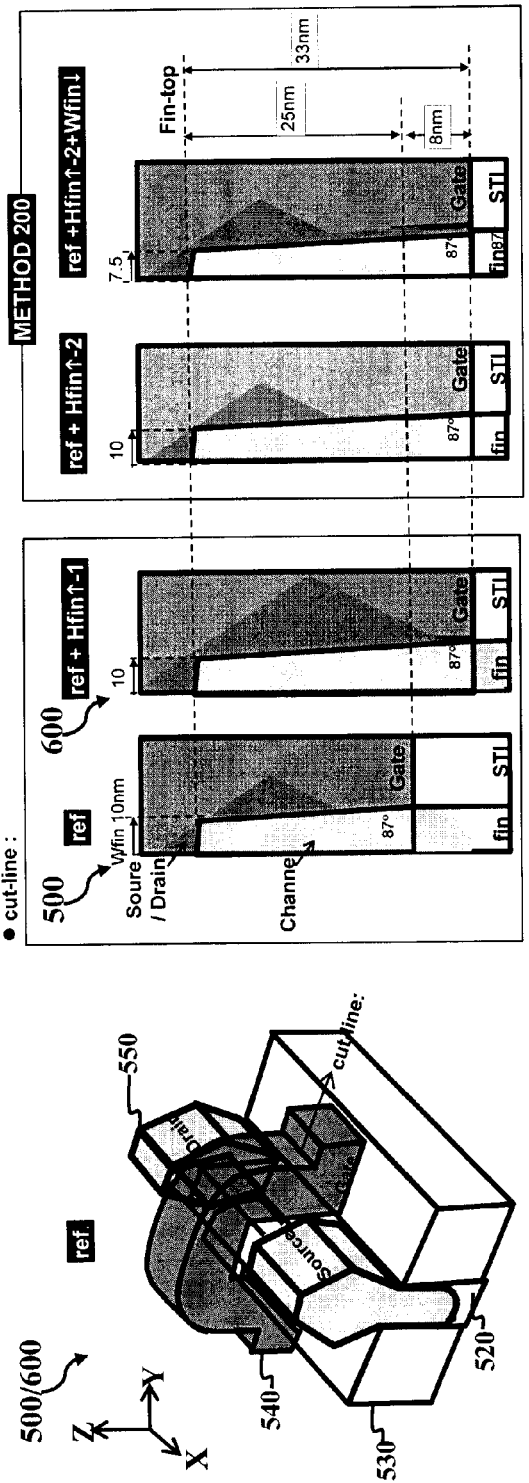
FIG. 14 provides device performance results of various FinFET devices according to various aspects of the present disclosure.

FIG. 14 compares performance between a FinFET device 500, a FinFET device 600, and the FinFET device 300 according to various aspects of the present disclosure. The FinFET device 500 and the FinFET device 600 include a fin 520 surrounded by an isolation feature 530; a gate structure 540 that wraps a portion of the fin 520, such that the gate structure 540 traverses the fin 520, separating a source region and a drain region of the fin 520, where a channel is defined between the source region and the drain region of the fin 520; and epitaxial source/drain features 550 disposed over the fin 520 in the source region and the drain region. The FinFET device 500, designated as a reference (ref) FinFET device, is fabricated by conventional methods. When fabricated by conventional methods, a portion of the fin 520 associated with the channel has a height (Hfin) of about 25 nm and a width (Wfin) of about 10 nm. The FinFET device 600 (ref+Hfin↑−1) is fabricated by a method that increases a height of the fin 520 before a gate replacement process, such that the portion of the fin 520 associated with the channel has a height (Hfin) of about 33 nm and a width (Wfin) of about 10 nm. As described above, the method 200 increases a height and/or decreases a width of a portion of the fin associated with the channel during a gate replacement process. For performance comparison, where the FinFET device 300 is fabricated by the method 200 to increase the height of the portion of the fin 325 during the gate replacement process (ref+Hfin↑−2), the portion of the fin 325 associated with the channel has a height (Hfin) of about 33 nm and a width (Wfin) of about 10 nm; and where the FinFET device 300 is fabricated by the method 200 to increase the height and decrease the width of the portion of the fin 325 during the gate replacement process (ref+Hfin↑−2+Wfin↓), the portion of the fin 325 associated with the channel has a height (Hfin) of about 33 nm and a width (Wfin) of about 7.5 nm.

The FinFET device 300 performs significantly better than the FinFET device 500 and the FinFET device 600. Referring to table 700, the FinFET device 300 fabricated by the method 200 exhibits increased effective drive current (Ideff). For example, the effective drain current of the FinFET device 300 fabricated by the method 200 to increase the height of the portion of the fin 325 during the gate replacement process (ref+Hfin↑−2) is significantly higher for both n-type (N) and p-type (P) devices when compared to the FinFET device 500 fabricated by conventional methods and slightly higher for both n-type and p-type devices when compared to the FinFET device 600 fabricated by a method that increases a height of the fin before a gate replacement process. Further, the FinFET device 300 fabricated by the method 200 to increase the height and decrease the width of the portion of the fin 325 during the gate replacement process (ref+Hfin↑−1+Wfin↓) is significantly higher for both n-type and p-type devices when compared to the FinFET device 500 fabricated by conventional methods and the FinFET device 600 fabricated by a method that increases a height of the fin before a gate replacement process. In another example, the FinFET device 300 fabricated by the method 200 exhibits significant improvement in total capacitance (Ctotal), (1/Ieff), and intrinsic gate delay (CV/I). In particular, the intrinsic gate delay of the FinFET device 300 fabricated by the method 200 to increase the height of the portion of the fin 325 during the gate replacement process (ref+Hfin↑−2) exhibits about a 10% improvement when compared to the FinFET device 500 fabricated by conventional methods; and the intrinsic gate delay of the FinFET device 300 fabricated by the method 200 to increase the height and decrease the width of the portion of the fin 325 during the gate replacement process (ref+Hfin↑−2+Wfin↓) exhibits about a 13% improvement when compared to the FinFET device 500 fabricated by conventional methods. In contrast, intrinsic gate delay of the FinFET device 600 fabricated by a method that increases a height of the fin before a gate replacement process is worse than that exhibited by FinFET device 500, such that the FinFET device 600 has degraded device performance when compared to the FinFET device 500. Further, the FinFET device 300 fabricated by the method 200 (both ref+Hfin↑−2 and ref+Hfin↑−2+Wfin↓) exhibits slight degradation in total capacitance when compared to the FinFET device 500 fabricated by conventional methods, whereas the FinFET device 600 fabricated by a method that increases a height of the fin before a gate replacement process exhibits a significant increase in total capacitance. By exhibiting minimal total capacitance degradation, decreased intrinsic gate delay, and/or increased effective drive current, the FinFET device 300 provides adequate AC performance while improving DC performance. Thus, device performance significantly improves by maximizing the height and/or minimizing the width of the portion of the fin associated with the channel during the gate replacement process. As noted above, different embodiments may have different advantages, and no particularly advantage is necessarily required of any embodiment.

The present disclosure provides for many different embodiments. In an example, a method includes providing a substrate; forming a fin over the substrate; forming an isolation feature over substrate; forming a gate structure including a dummy gate over a portion of the fin, the gate structure traversing the fin, wherein the gate structure separates a source region and a drain region of the fin, a channel being defined in the portion of the fin between the source region and the drain region; and replacing the dummy gate of the gate structure with a metal gate, wherein during the replacing the dummy gate, a profile of the portion of the fin is modified. In an example, forming the fin over the substrate includes forming a semiconductor layer over the substrate, patterning the semiconductor layer to form the fin. In an example, modifying the profile of the portion of the fin includes increasing a height of the portion of the fin and/or decreasing a width of the portion of the fin. In an example, the height is increased by performing an etching process on the isolation feature. The etching process can be further performed to increase a length of the channel. In an example, the etching process is an oxide etching process. In an example, the height is greater than about 35 nm and the width is less than about 8 nm. The method further includes forming epitaxial source/drain features in the source region and the drain region of the fin before replacing the dummy gate. In an example, forming the epitaxial source/drain features in the source region and the drain region of the fin before replacing the dummy gate includes forming recesses in the fin in the source region and the drain region, and epitaxially growing a semiconductor material to fill the recesses. In an example, replacing the dummy gate of the gate structure with a metal gate includes removing the dummy gate from the gate structure, thereby forming an opening in the gate structure, the opening exposing the portion of the fin, and forming the metal gate in the opening of the gate structure.

In another example, a method includes forming a fin structure including fins over a substrate; forming an isolation feature over the fin structure to define a first fin height of the fins, the fins being isolated from each other by the isolation feature; forming a gate structure that includes a dummy gate stack over a portion of the fin structure such that the gate structure traverses each fin, thereby separating a source region and a drain region of each fin, the source region and the drain region defining a channel of each fin therebetween; forming epitaxial source/drain features in the source region and drain region of each fin; removing the dummy gate stack from the gate structure, thereby forming an opening in the gate structure; after removing the dummy gate stack, performing an etching process on the isolation feature to increase the first fin height of the fins to a second fin height; and after performing the etching process on the isolation feature, forming a metal gate stack in the opening of the gate structure. In an example, forming the fin structure including fins over the substrate includes forming a semiconductor layer over the substrate, and patterning the semiconductor layer to form the fin structure, wherein the fin structure includes a fin platform having the fins extending therefrom. In an example, the forming the fin structure defines a first fin width of the fins, and the etching process is further performed to decrease the first fin width of the fins to a second fin width. In an example, the etching process includes a first etching process for increasing the first fin height to the second fin height and a second etching process for decreasing the first fin width to the second fin width. In an example, the method further includes, after removing the dummy gate stack, performing an etching process to increase a length of the channel of each fin. In an example, etching process for increasing the length of the channel is an isotropic etching process. In an example, forming the epitaxial source/drain features in the source region and drain region of each fin includes forming recesses in each fin in the source region and the drain region, and epitaxially growing a semiconductor material to fill the recesses. In another example, forming the epitaxial source/drain features in the source region and drain region of each fin includes forming recesses in each fin in the source region and the drain region; forming recesses in the isolation feature adjacent to the source region and drain region of each fin; and epitaxially growing a semiconductor material to fill the recesses, such that the epitaxial source features of each fin are merged together and the epitaxial drain features of each fin are merged together.

In yet another example, a FinFET device includes a substrate; a fin structure having fins disposed over the substrate; a gate structure disposed over a portion of each fin, the gate structure traversing each fin such that the gate structure separates a source region and a drain region of each fin, the source region and the drain region defining a channel of each fin therebetween; wherein the source region and the drain region of each fin include an epitaxial source/drain feature; and wherein the portion of each fin has a height greater than about 35 nm and a width less than about 8 nm. In an example, the fin structure includes a fin platform having the fins extending therefrom.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin over a substrate;
    forming an isolation feature over the substrate;
    forming a gate structure including a dummy gate over a portion of the fin, the gate structure traversing the fin, wherein the gate structure separates a source region and a drain region of the fin, a channel being defined between the source region and the drain region; and
    replacing the dummy gate of the gate structure with a metal gate, wherein replacing the dummy gate of the gate structure with the metal gate includes:
        removing the dummy gate from the gate structure thereby forming an opening in the gate structure;
        after removing the dummy gate from the gate structure, modifying a profile of the portion of the fin by removing a piece of the portion of the fin; and
        after modifying the profile of the portion, forming the metal gate in the opening of the gate structure.

2. The method of claim 1 wherein the forming the fin over the substrate includes:
    forming a semiconductor layer over the substrate; and
    patterning the semiconductor layer to form the fin.

3. The method of claim 1 wherein the opening exposes the portion of the fin.

4. The method of claim 3 wherein modifying the profile of the portion further includes performing an etching process on the isolation feature to increase a height of the portion of the fin.

5. The method of claim 4 wherein the etching process is further performed to decrease a width of the portion of the fin.

6. The method of claim 5 wherein the height is greater than about 35 nm and the width is less than about 8 nm.

7. The method of claim 5 wherein the etching process is further performed to increase a length of the channel.

8. The method of claim 7 wherein the etching process is an oxide etching process.

9. The method of claim 1 further including forming epitaxial source/drain features in the source region and the drain region of the fin before replacing the dummy gate.

10. The method of claim 9 wherein the forming the epitaxial source/drain features in the source region and the drain region of the fin before replacing the dummy gate includes:
    forming recesses in the fin in the source region and the drain region; and
    epitaxially growing a semiconductor material to fill the recesses.

11. A method comprising:
    forming a fin structure including fins over a substrate;
    forming an isolation feature over the fin structure to define a first fin height of the fins, the fins being isolated from each other by the isolation feature;
    forming a gate structure that includes a dummy gate stack over a portion of the fin structure such that the gate structure traverses each fin, thereby separating a source region and a drain region of each fin, the source region and the drain region defining a channel of each fin therebetween;
    forming epitaxial source/drain features in the source region and drain region of each fin;
    removing the dummy gate stack from the gate structure, thereby forming an opening in the gate structure;
    after removing the dummy gate stack, performing an etching process on the isolation feature to increase the first fin height of the fins to a second fin height; and
    after performing the etching process on the isolation feature, forming a metal gate stack in the opening of the gate structure, and
    wherein the forming the epitaxial source/drain features in the source region and drain region of each fin includes:

forming recesses in each fin in the source region and the drain region; and epitaxially growing a semiconductor material to fill the recesses.

12. The method of claim 11 wherein the forming the fin structure including fins over the substrate includes:

forming a semiconductor layer over the substrate; and patterning the semiconductor layer to form the fin structure, wherein the fin structure includes a fin platform having the fins extending therefrom.

13. The method of claim 11 wherein:

the forming the fin structure defines a first fin width of the fins; and the etching process is further performed to decrease the first fin width of the fins to a second fin width.

14. The method of claim 13 wherein the etching process includes a first etching process for increasing the first fin height to the second fin height and a second etching process for decreasing the first fin width to the second fin width.

15. The method of claim 11 further including, after removing the dummy gate stack, performing an etching process to increase a length of the channel of each fin.

16. The method of claim 15 wherein the performing the etching process to increase the length of the channel of each fin includes performing an isotropic etching process.

17. The method of claim 11 wherein forming recesses in each fin in the source region and the drain region further includes forming recesses in the isolation feature adjacent to the source region and drain region of each fin; and wherein epitaxially growing the semiconductor material to fill the recesses includes the semiconductor material filling the recesses such that the epitaxial source features of each fin are merged together and the epitaxial drain features of each fin are merged together.

18. The method of claim 1, wherein modifying the profile of the portion of the fin further includes modifying the profile of the portion in increase a length of the channel.

19. A method comprising:

forming a fin over a substrate;

forming a gate structure including a dummy gate over a portion of the fin, the gate structure traversing the fin, wherein the gate structure separates a source region and a drain region of the fin, a channel being defined between the source region and the drain region;

removing the dummy gate from the gate structure thereby forming an opening in the gate structure;

after removing the dummy gate, modifying a profile of the portion of the fin to increase a length of the channel; and after modifying the profile of the portion of the fine, forming a metal layer in the opening of the gate structure.

20. The method of claim 19, wherein modifying the profile of the portion of the fin further includes modifying the profile of the portion to decrease a width of the portion of the fin.

* * * * *